United States Patent
Green et al.

(10) Patent No.: US 7,253,486 B2
(45) Date of Patent: Aug. 7, 2007

(54) FIELD PLATE TRANSISTOR WITH REDUCED FIELD PLATE RESISTANCE

(75) Inventors: Bruce M. Green, Gilbert, AZ (US); Ellen Lan, Chandler, AZ (US); Phillip Li, Scottsdale, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 1201 days.

(21) Appl. No.: 10/209,746

(22) Filed: Jul. 31, 2002

(65) Prior Publication Data

US 2004/0021182 A1    Feb. 5, 2004

(51) Int. Cl.
*H01L 29/76* (2006.01)

(52) U.S. Cl. ............ 257/409; 257/340; 257/488; 257/486; 257/339; 257/146; 257/508; 257/509; 438/140; 438/454

(58) Field of Classification Search ......... 257/409, 257/340, 488, 489, 339, 146, 509, 288, 508; 438/160, 654
See application file for complete search history.

(56) References Cited

U.S. PATENT DOCUMENTS

| | | | |
|---|---|---|---|
| 5,119,149 A | 6/1992 | Weitzel et al. |
| 5,252,848 A | 10/1993 | Adler et al. |
| 5,898,198 A | 4/1999 | Herbert et al. |
| 5,918,137 A | 6/1999 | Ng et al. |
| 6,001,710 A | 12/1999 | Francois et al. |
| 6,091,110 A | 7/2000 | Hebert et al. |
| 6,172,400 B1 | 1/2001 | Ng et al. |

*Primary Examiner*—Sara Crane
*Assistant Examiner*—Junghwa Im

(57) ABSTRACT

In one example embodiment, a transistor (100) is provided. The transistor (100) comprises a source (10), a gate (30), a drain (20), and a field plate (40) located between the gate (30) and the drain (20). The field plate (40) comprises a plurality of connection locations (47) and a plurality of electrical connectors (45) connecting said plurality of connection locations (47) to a potential.

20 Claims, 4 Drawing Sheets

FIELD PLATE TRANSISTOR WITH REDUCED FIELD PLATE RESISTANCE

BACKGROUND OF THE INVENTION

The present invention relates generally to field plate transistors, and more particularly to field plate transistors with increased breakdown voltage and reduced capacitance between the gate and drain.

Very generally speaking, a conventional transistor design has a source, a drain, and gate. The output current of the transistor is controlled by the voltage applied to the gate. However, in many conventional transistor designs, the breakdown voltage is lower than desired, and a capacitance forms between the gate and the drain. This capacitance reduces the gain of the transistor.

The two main sources of a transistor's gate-to-drain capacitance are an inter-electrode capacitance (between the gate metalization and the drain metalization) and a capacitive coupling between the gate and drain (due to the space charge region in the semiconductor material). The space charge region in the semiconductor material extends from a point beneath the gate electrode to the drain of the transistor.

One attempt to reduce this capacitance has been to place a conductor between the gate and drain. The conductor is electrically isolated from the substrate of the transistor by a dielectric, and electrically connected to the source. See, e.g., U.S. Pat. Nos. 5,119,149, 5,252,848, and 6,091,110, all of which are incorporated herein by reference. This conductor is typically called a "field plate." The field plate increases the breakdown voltage of the transistor by redistributing the electric field at the gate edge of the transistor such that the gate-drain voltage is dropped across the dielectric layer instead of the semiconductor surface.

In practice, the field plate is positioned so close to the gate that self-aligned techniques are needed to obtain the desired spacing. Materials used in self-aligned processes, such as Titanium Tungsten Nitride, are highly resistive; and, because the field plate is elongated across the transistor, the voltage drops along the field plate. Thus, the field plate's ability to reduce capacitance is diminished in the regions away from the field plate connection to the source. As used herein, the term "highly resistive" refers to materials which, in the application of field plates in transistors, have resistivities sufficient to cause a change of potential along the length of a field plate that results in a significant change in performance (e.g., Titanium Tungsten Nitride and Tungsten Silicide). Such materials are in contrast to examples of less resistive materials (e.g., gold and aluminum).

DETAILED DESCRIPTION OF EXAMPLE EMBODIMENTS OF THE PRESENT INVENTION

Figure 1:
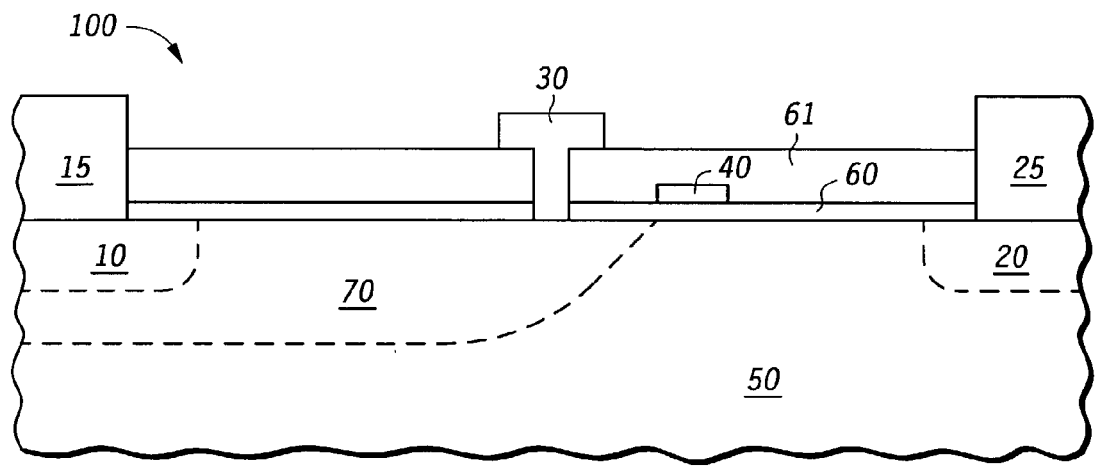
FIG. 1 shows a cross-sectional view of aspects of an example embodiment of the present invention.

FIG. 1 shows a cross-sectional view of a generalized transistor 100 illustrating aspects of an example embodiment of the present invention. FIG. 1 shows a transistor 100 with a source electrode 15 above a source region 10 of a substrate 50 and a drain electrode 25 above a drain region 20 of the substrate 50. A gate 30 is located between the source electrode 15 and the drain electrode 25. A channel region 70 is located beneath the gate 30 and between the source region 10 and the drain region 20. A field plate 40 is located between the gate 30 and the drain electrode 25 and is electrically isolated from the substrate 50 by a layer of dielectric 60 that is located between the field plate 40 and the substrate 50. As second dielectric 61 covers the field plate 40.

FIG. 1 is an abstraction of many transistors employing aspects of the present invention. In various embodiments, the transistor 100 is built on any type of substrate, whether p-type, n-type, or any other type; and the materials and doping of the various regions, such as the source 10, drain 20, and channel 70, will vary to include Silicon, Germanium, Gallium Arsenide, or any other type of semiconductor materials. The invention is not limited to any specific material chosen. Likewise, the conductors, insulators, passivations, and other layers are comprised of a variety of materials and do not limit the invention.

Figure 2:
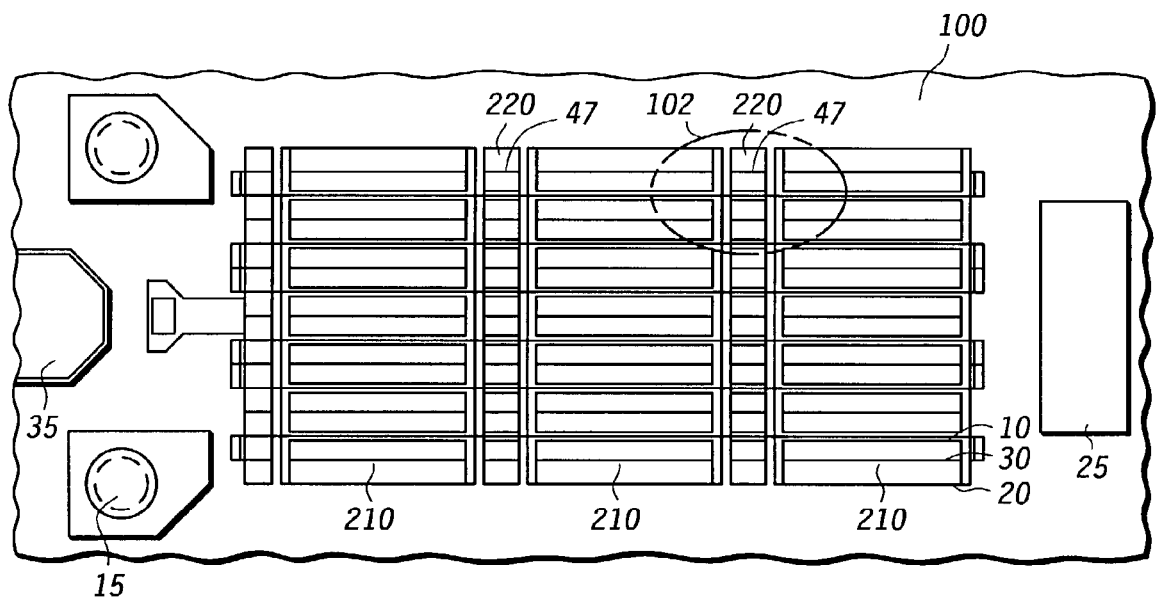
FIG. 2 shows a top view of an example embodiment of the invention.

FIG. 2 shows a transistor 100 that comprises a series of elongated source fingers 10, gate fingers 30, and drain fingers 20. The term "finger" refers to the elongated shape of the source 10, gate 30, and drain 20, as these components extend across the transistor 100. The source finger 10 and drain finger 20 extend across three active transistor areas 210 (e.g., active area mesas). Between each of the active areas 210 are regions 220 of substantially reduced electrical activity, at least in comparison to neighboring regions 210 designed for substantial electrical activity. In many embodiments, regions 220 comprise essentially inactive electrical regions. In various embodiments, the location of the source electrode 15, the drain electrode 25, and gate electrode 35 will vary based upon numerous design considerations.

Figure 3:
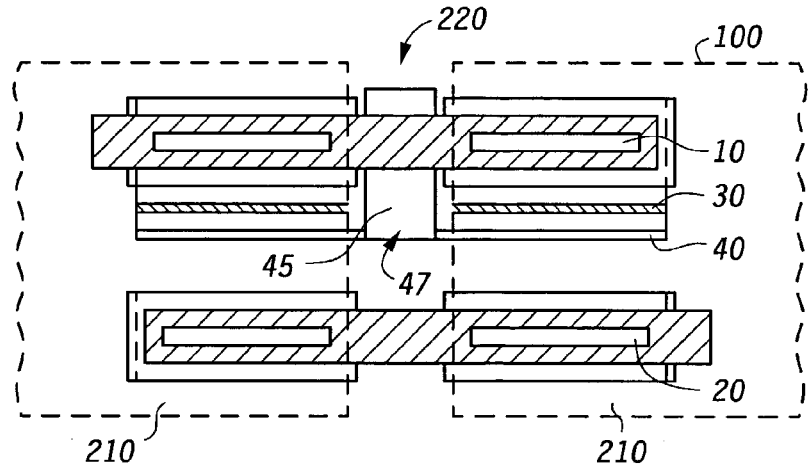
FIG. 3 shows a close-up top view of a portion of the example of FIG. 2.

FIG. 3 shows an enlarged top view of portion 102 of FIG. 2, where gate finger 30 resides between the source finger 10 and the drain finger 20, and an elongated field plate 40 is located between the gate finger 30 and the drain 20. The source finger 10, the drain finger 20, the gate finger 30, and the field plate 40, extend across both the active areas 210 and the region 220. A location 47 on the field plate 40 above the region 220 is electrically connected to the source 10 with a conductive connector 45. In some alternate embodiments, an extension of the field plate 40 itself, a wire, and/or any other connector, are used in place of, or in addition to, connector 45.

Figure 4:
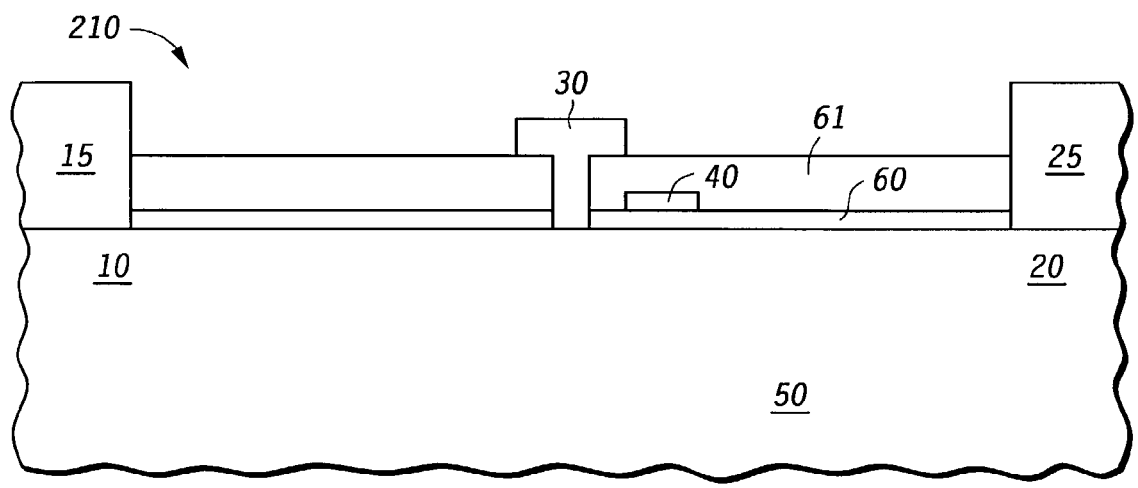
FIG. 4 shows a cross-sectional view of a segment of the example of FIG. 3.

FIG. 4 shows a cross-sectional view of the active area 210 of FIG. 3. The field plate 40 is physically separated from the substrate 50 with a dielectric 60 for the purpose of improving the performance of the transistor 100.

Figure 5:
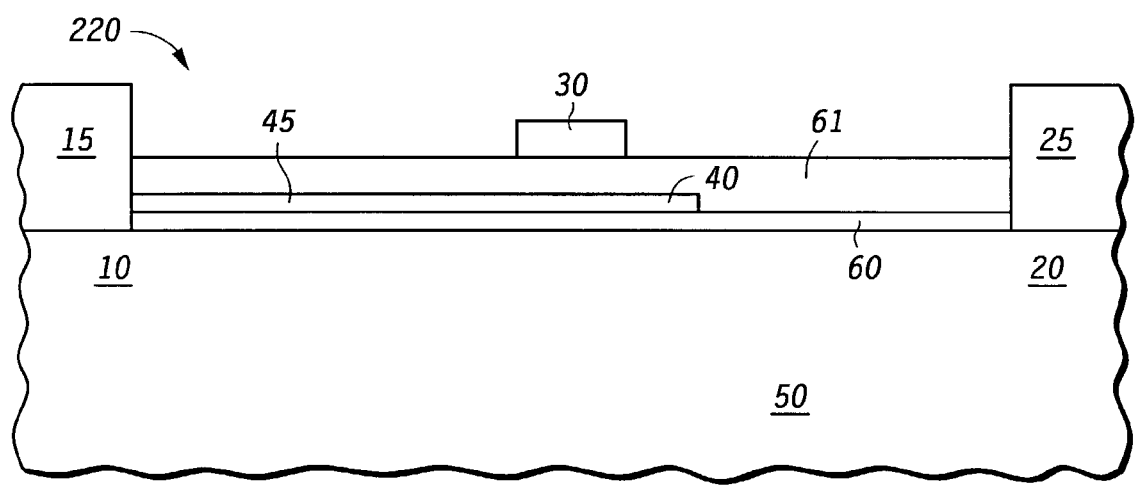
FIG. 5 shows a cross-sectional view of a segment of the example of FIG. 3.

FIG. 5 shows a cross-sectional view of the area of reduced electrical activity 220 of FIG. 3. The field plate 40 is electrically connected to the source 10 with an electrical connector 45. In various embodiments, an inactive region 220 comprises a region of the substrate 50, where the crystalline structure has been damaged to reduce conductivity, (such as isolation implanted Gallium Arsenide), or a region where the conductive material of the substrate has been simply removed (such as by etching). In still other embodiments, other materials, suitable for a region of reduced electrical activity, are used. The connector 45 is also separated from the substrate 50 of the region 220 by the dielectric 60, in the illustrated example.

By electrically connecting the field plate 40 to the source 10 at various locations 47 across the field plate finger 40, the voltage of the field plate 40 at each location 47 is maintained. Thus, if the field plate 40 is made of a high resistivity material (e.g., TiWN) (or even if not a highly resistive material) the field plate voltage across the transistor 100 is more consistent than with a single, remote connection.

In an alternate embodiment (not illustrated), the field plate 40 is not electrically connected to the source 10. Instead, the field plate 40 is connected to some potential (such as ground, gate, or some other potential) at a plurality of locations 47 along the field plate finger 40. At each of these locations 47, the potential of field plate 40 is stabilized along the length of the field plate 40.

Figure 6:
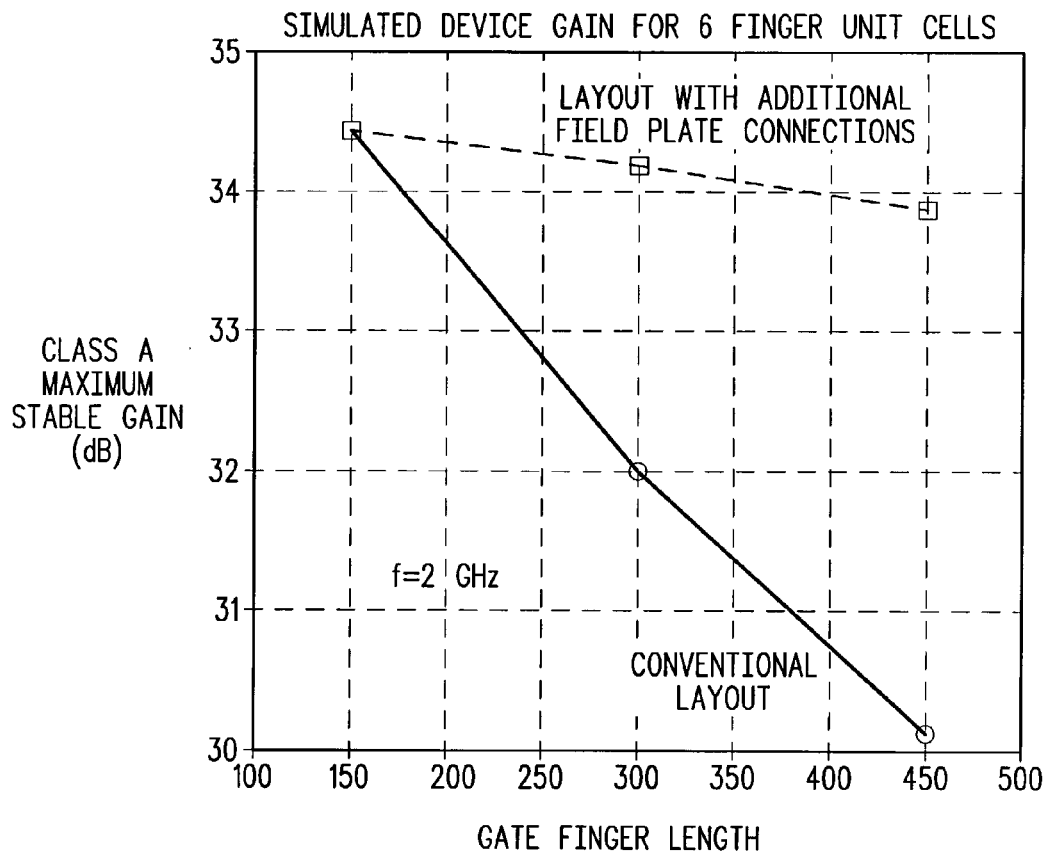
FIG. 6 shows a comparison of certain aspects of an example embodiment of the present invention with conventional transistors.

FIG. 6 shows a comparison of certain aspects of an example embodiment of the present invention with conventional transistors. The unbroken line illustrates that as the gate finger of a conventional field plate transistor increases, the maximum stable gain of the transistor decreases dramatically. By contrast, the dotted line indicates that the gain of a transistor with multiple connections to a potential along the field plate decreases only slightly. Thus, multiple electrical connections to a potential along the field plate improve the maximum stable gain, and reduces the variation of gain, for a longer field plate finger.

By electrically segmenting the field plate 40 and tying a plurality of locations 47 of the field plate 40 to a potential, the field plate resistance of the transistor 100 is reduced based essentially on the following equation:

$$R_{fp,eff}=1/(4(N-1)^2)*R_{fp};$$

where $R_{fp,eff}$ is the effective field plate resistance of a transistor with a plurality of locations electrically connected to a potential. $R_{fp}$ is the field plate resistance of the transistor without a plurality of electrical connections to a potential, and N is the number of connections to the potential.

Figure 7:
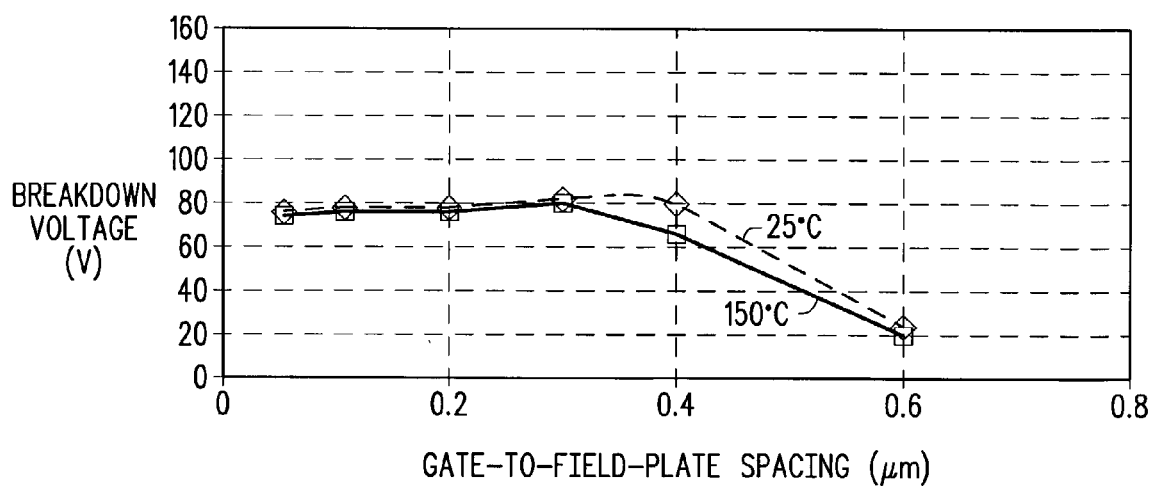
FIG. 7 shows aspects of transistor performance at two different temperatures.

Turning now to temperature, FIG. 7 shows a simulated comparison of two transistors operating at different temperatures. A transistor operating at 150° C. is compared with a transistor operating at 25° C. Looking first at the gate-to-field-plate spacing (the distance along the surface of the dielectric 60 between the gate 30 and the field plate 40), FIG. 7 illustrates that the breakdown voltage is essentially constant for a transistor operating at 25° C. up to about 0.4 microns of gate-to-field-plate spacing. Therefore, it is an advantage, in many embodiments, to keep the gate-to-field-plate-spacing small. However, as the temperature of the transistor increases, the breakdown voltage decreases. For a transistor operating at 150° C., with the same gate-to-field-plate spacing (0.4 microns), the breakdown voltage has begun to drop. Therefore, maintaining a lower operating temperature of the transistor is beneficial.

Figure 8:
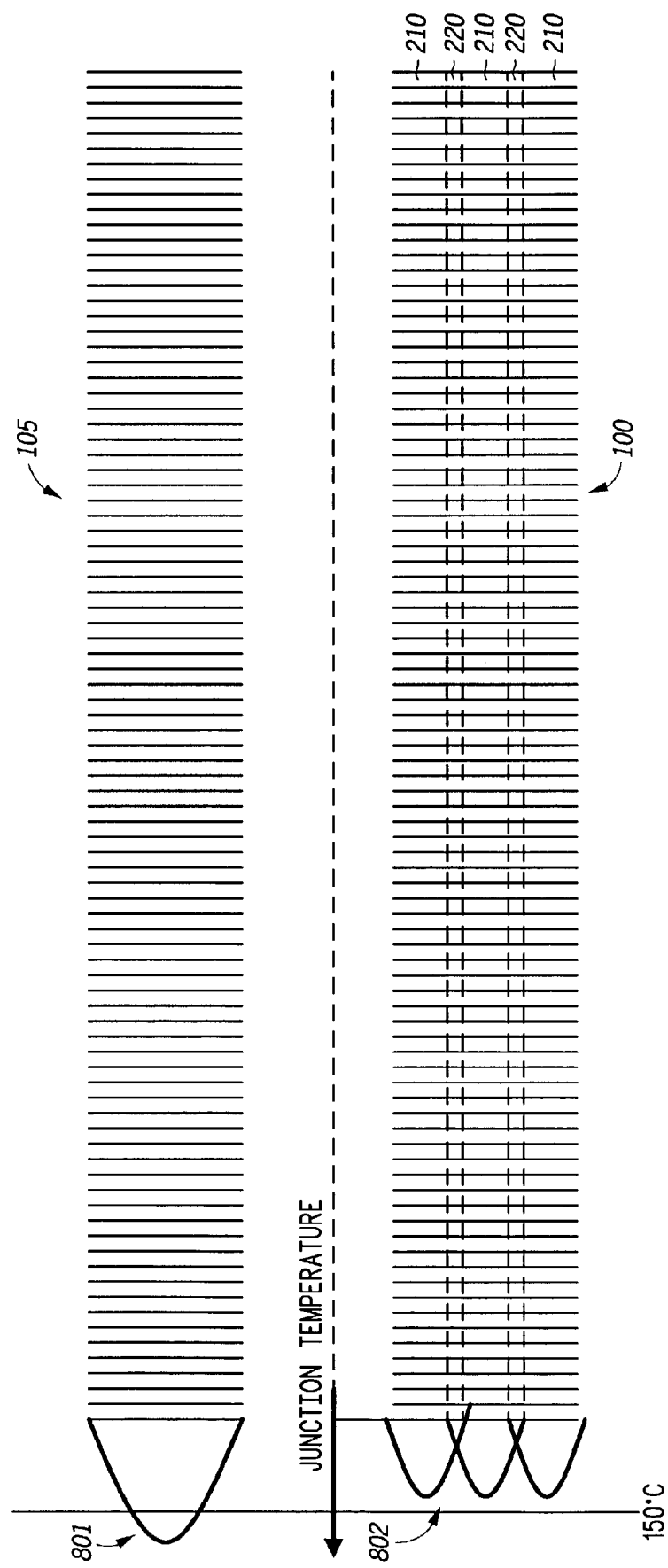
FIG. 8 shows a comparison of certain aspects of an example embodiment of the present invention with conventional transistors.

FIG. 8 is a generalized view of a conventional transistor 105 above a generalized top view of an example transistor 100 of the example embodiments of FIGS. 1-5. The transistor 100 comprises active regions 210 which are separated by significantly reduced or inactive regions 220. Because there are areas of reduced electrical activity (e.g., reduced activity regions 220), and thus reduced heat, the overall temperature of transistor 100 is reduced, as illustrated by junction temperature comparison graphs 801 and 802.

In alternative embodiments, inactive or reduced activity regions 220 comprise regions of the conductive substrate whose crystalline structure has been damaged to make them less conductive or regions that have been simply cut out of the conductive substrate. Of course, in some embodiments of the present invention, a conventional single mesa (no inactive regions) is used without the thermal benefits of the inactive regions 220.

Turning now to a further aspect of the present invention, various functions are performed by the previously-described structures or their equivalents, and a system is provided by those functions. The system generally comprises means for maintaining a potential, means for connecting a first location on the field plate to a potential, and means for connecting a second location on the field plate to a potential.

In the system illustrated in FIGS. 3 and 4, the means for maintaining a potential comprises the source 10. In alternate embodiments, the means for maintaining the potential comprises a ground, a source, a gate, an alternate voltage source, or any other means for maintaining a potential that will occur to those of ordinary skill in the art. Furthermore, FIGS. 3 and 4 illustrate an example means for electrically connecting the first and second locations 47 on field plate 40 to a potential as a connector 45. In alternate embodiments, acceptable means for connecting comprise wire, alternate electrical conductors, or any other method of electrically connecting that will occur to those of ordinary skill in the art.

The example embodiments of the present invention have been described with a certain degree of particularity; however, many changes may be made in the details without departing from the scope of the invention. It is understood that the invention is not limited to the embodiments set forth herein, but is to be limited only to the scope of the attached claims, including the full range of equivalency to which each element thereof is entitled.

We claim:

1. A transistor, the transistor comprising:
   a source;
   a gate;
   a drain;
   a field plate located between the gate and the drain,
      wherein said field plate comprises a plurality of connection locations; and
   a plurality of electrical connectors connecting said plurality of connection locations to a potential.

2. The transistor of claim 1, wherein said field plate comprises a highly resistive material.

3. The transistor of claim 2, wherein said highly resistive material comprises Titanium Tungsten Nitride.

4. The transistor of claim 1, wherein said potential comprises a source potential.

5. The transistor of claim 1, wherein said potential comprises a ground potential.

6. The transistor of claim 1, wherein said potential comprises a gate potential.

7. The transistor of claim 1, wherein said plurality of connection locations are essentially equidistant from one another.

8. The transistor of claim 1, wherein said plurality of electrical connectors are located in a region having electrical activity that is reduced in comparison to the electrical activity designed for a neighboring region.

9. The transistor of claim 8, wherein said plurality of electrical connectors and said field plate comprises highly resistive material.

10. The transistor of claim 1, wherein said plurality of electrical connectors are located in an active region.

11. A system for reduction of gate-to-drain capacitance in a transistor, the system comprising:
   means for connecting a plurality of locations on a field plate finger to a potential, the field plate finger being located between a drain of a transistor and a source of the transistor; and
   means for applying a voltage to the means for connecting.

12. A system as in claim 11, wherein said means for connecting comprises a set of electrical conductors spaced along the field plate finger.

13. A system as in claim 12, wherein said set of electrical conductors are spaced at a plurality of essentially equidistant locations along the field plate finger.

14. A system as in claim 12, wherein said means for applying comprises an electrical conductor between the means for connecting and a potential.

15. A system as in claim 14, wherein said potential comprises a source potential.

16. A system as in claim 14, wherein said potential comprises a ground potential.

17. A system as in claim 14, wherein said potential comprises a gate potential.

18. A system as in claim 11, wherein said means for connecting is located in a region of electrical activity that is substantially less than a designed electrical activity level of a neighboring region.

19. The transistor of claim 1 wherein:
   the field plate extends in a first direction;
   the plurality of connectors extend in a second direction, the second direction being perpendicular to the first direction.

20. The transistors of claim 1 wherein the field plate and the plurality of connectors are located in the same plane as the field plate.

* * * * *